US006828642B2

(12) United States Patent
Claiborne et al.

(10) Patent No.: US 6,828,642 B2
(45) Date of Patent: Dec. 7, 2004

(54) DIFFRACTION GRATING COUPLED INFRARED PHOTODETECTOR

(75) Inventors: Lewis T. Claiborne, Richardson, TX (US); Pradip Mitra, Grand Prairie, TX (US)

(73) Assignee: Lockhead Martin Corporation, Bethesda, MD (US)

( * ) Notice: Subject to any disclaimer, the term of this patent is extended or adjusted under 35 U.S.C. 154(b) by 772 days.

(21) Appl. No.: 09/836,036

(22) Filed: Apr. 17, 2001

(65) Prior Publication Data

US 2002/0148963 A1 Oct. 17, 2002

(51) Int. Cl.$^7$ .......................................... H01L 31/0352
(52) U.S. Cl. ..................... 257/440; 257/21; 250/338.1; 250/338.4
(58) Field of Search ................ 257/440, 21; 250/338.1, 250/338.4

(56) References Cited

U.S. PATENT DOCUMENTS

| | | | |
|---|---|---|---|
| 5,315,128 A | 5/1994 | Hunt et al. ................... 257/16 |
| 5,389,797 A | 2/1995 | Bryan et al. .................. 257/21 |
| 5,455,421 A | 10/1995 | Spears ..................... 250/338.4 |
| 5,479,018 A | 12/1995 | McKee et al. ........... 250/338.1 |
| 5,485,015 A | 1/1996 | Choi ........................... 257/21 |
| 5,539,206 A | 7/1996 | Schimert ................. 250/338.4 |
| 5,726,805 A | 3/1998 | Kaushik et al. ............. 359/589 |
| 5,773,831 A | 6/1998 | Brouns .................. 250/370.08 |
| 5,818,066 A | 10/1998 | Duboz ......................... 257/21 |
| 6,091,127 A | 7/2000 | Chandra et al. ............ 257/442 |
| 6,180,990 B1 * | 1/2001 | Claiborne et al. .......... 257/440 |
| 6,441,373 B1 * | 8/2002 | Masalkar ................ 250/338.1 |

OTHER PUBLICATIONS

J. Bajaj, *State-of-the-art HgCdTe Infrared Devices*, Proceedings of SPIE, In *Photodetectors: Materials and Devices V*, Gail J. Brown and Manijeh Razeghi, Editors, vol. 3948, pp. 42–54, (2000).

I. M. Baker, *Photovoltaic IR detectors, Narrow–gap II–VI Compounds for Optoelectronic and Electromagnetic Applications*, Peter Capper, Editor, Chapman & Hall, pp. 450–474 (undated).

C. C. Barron, C. J. Mahon, B. J. Thibeault, G. Wang, W. Jiang, L. A. Coldren and J. E. Bowers, *Resonant–cavity–enhanced pin photodetector with 17GHz bandwidth–efficiency product, Electronics Letters*, vol. 30, No. 21, pp. 1796–1797 (Oct. 13, 1994).

T. Wipiejewski, K. Panzlaff, K. J. Ebeling, *Resonant wavelength selective photodetectors, Microelectronic Engineering*, vol. 19, pp. 223–226 (1992).

* cited by examiner

*Primary Examiner*—Kiet T. Nguyen
(74) *Attorney, Agent, or Firm*—Sidley Austin Brown & Wood LLP

(57) ABSTRACT

A diffraction grating coupled infrared photodetector for providing high performance detection of infrared radiation is described. The photodetector includes a three-dimensional diffractive resonant optical cavity formed by a diffraction grating that resonates over a range of infrared radiation wavelengths. By placing a limited number of p/n junctions throughout the photodetector, the photodetector thermal noise is reduced due to the reduction in junction area. By retaining signal response and reducing the noise, the sensitivity increases at a given operating temperature when compared to traditional photovoltaic and photoconductive infrared photodetectors up to the background limit. The photodetector device design can be used with a number of semiconductor material systems, can form one- and two-dimensional focal plane arrays, and can readily be tuned for operation in the long wavelength infrared and the very long wavelength infrared where sensitivity and noise improvements are most significant.

60 Claims, 2 Drawing Sheets

DIFFRACTION GRATING COUPLED INFRARED PHOTODETECTOR

FIELD OF THE INVENTION

The present invention relates to a photodetector sensitive to infrared radiation. In particular, the present invention provides for a diffraction grating coupled infrared photodetector with improved sensitivity by decreasing the thermal leakage current and thus the noise.

BACKGROUND OF THE INVENTION

In the field of infrared (IR) imaging, the current objective is to provide large area focal plane arrays at low cost with high performance. InSb, HgCdTe, and quantum well infrared photodetector (QWIP) technologies have demonstrated high performance large area focal plane arrays. Each of these technologies has various strengths and weaknesses. InSb photodetectors offer high performance and ease of fabrication, but must be cooled to approximately 80 K. HgCdTe photodetectors can be designed to operate in the middle wavelength IR (MWIR) corresponding to a wavelength range of 3 to 5 $\mu$m, the long wavelength IR (LWIR) corresponding to a wavelength range of 8 to 12 $\mu$m, or the very long wavelength IR (VLWIR) corresponding to a wavelength range of greater than 12 $\mu$m. However, HgCdTe photodetectors require very tight tolerances in material and fabrication uniformity to ensure high performance. QWIP photodetectors have been demonstrated in the MWIR, the LWIR, and the VLWIR while requiring only moderate tolerances in both material and fabrication uniformity.

Because photodetectors fabricated from HgCdTe have the greatest potential performance at a given operating temperature, significant time and effort have been expended to improve the HgCdTe starting material and fabrication process. While progress has been made, the cost of implementing these improvements is significant. Thus, there exists a need for a design that places fewer and/or less stringent requirements upon the starting material and/or the fabrication process.

SUMMARY OF THE INVENTION

In one embodiment of the present invention, a photodetector comprises a plurality of intersecting elongate IR absorbing elements, an enlargement of a portion of one of the elongate IR absorbing elements to form a collector element, a carrier collector, a first electrical contact electrically connected to the carrier collector, a second electrical contact connected to the elongate IR absorbing elements, and a reflector. The plurality of intersecting elongate IR absorbing elements form a two-dimensional diffraction grating that is designed to resonate at the IR wavelength of interest. The collector element may be a number of shapes including a circle, an oval, or a diamond. The carrier collector is formed within a portion of the collector element.

In another embodiment of the present invention, the collector elements are formed midway between the intersections of the IR absorbing elements. Another embodiment of the present invention includes collector elements that are formed at both the intersections of the IR absorbing elements and midway between the intersections of the IR absorbing elements.

In another embodiment of the present invention, the diffraction grating is designed to resonate at two different wavelengths. The first wavelength resonates in a first direction of the grating while the second wavelength resonates in a direction normal to the first direction. The wavelengths are within ten percent of each other, thereby allowing a broader spectral response.

In each of these embodiments, the IR radiation is absorbed in the IR absorbing elements and the resultant electrical carriers are attracted to the nearest carrier collector. These electrical carriers are sensed in an external circuit via the first and second contacts. The electrical carriers may be sensed as a current if the external circuit is of low impedance or as a voltage if the external circuit is of high impedance.

Photodetectors comprising a single element, a one-dimensional line array of photodetectors, or a two-dimensional area array of photodetectors are envisioned. Depending upon the specific embodiment, a number of different material systems may be used to form the IR absorbing elements, the collector elements, the carrier collectors, and the first and second electrical contacts. These material systems include II–VI semiconductor compounds that include elements from group II and group VI of the periodic table and III–V semiconductor compounds that include elements from group III and group V of the periodic table.

BRIEF DESCRIPTION OF THE DRAWINGS

The present invention is described in reference to the following Detailed Description and the drawings in which.

DETAILED DESCRIPTION OF THE PREFERRED EMBODIMENTS

Various embodiments of the present invention are described in detail with reference to the drawings with corresponding elements having corresponding numbers throughout the drawings.

Figure 1:
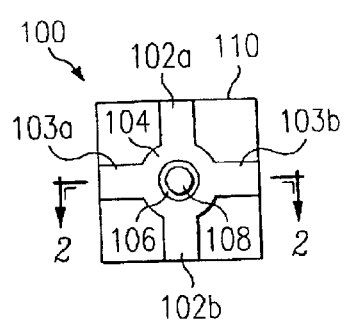
FIG. 1 is a top down view of a unit cell of a first embodiment of the present invention.

FIG. 1 is a top down view of a unit cell 100 of a first embodiment of the present invention; the unit cell 100 being replicating as required to form a diffraction grating coupled infrared (IR) photodetector. Depending upon the desired absorption wavelength, the unit cell size will vary. For a very long wavelength IR (VLWIR) wavelength peak of 18 $\mu$m, the unit cell 100 will have a pitch of approximately 12 $\mu$m. FIG. 1 includes first elongate elements 102a,b and second elongate elements 103a,b for absorbing the incident IR radiation. A typical width for these elongate elements 102a,b, 103a,b in a VLWIR photodetector is 2.5 $\mu$m. A collector element 104 is formed at the intersection of the first elongate elements 102a,b and the second elongate elements 103a,b.

Figure 2:
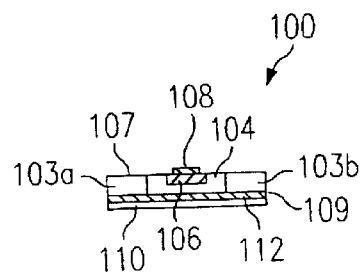
FIG. 2 is a cross-sectional view of the first embodiment of the present invention.

For the VLWIR photodetector example, the radius of the collector element 104 is 3 μm. A carrier collector 106 is formed within the collector element 104. This carrier collector 106 has a radius of 2 μm in the present VLWIR photodetector example. As seen in FIG. 2, the carrier collector 106 extends only a portion of the way into the collector element 104. A first electrical contact 108 is formed on the carrier collector 106. The first electrical contact 108 of the present VLWIR photodetector example has a radius of 1 μm. Lastly, FIG. 1 shows a reflector 110 below the previous elements, and is more clearly seen in the cross-sectional view of FIG. 2.

A photodetector having a unit cell 100 as shown in FIG. 1 could be formed from planar starting semiconductor material. The various required layers would be grown on a substrate. Continuing the VLWIR example, a CdTe or CdZnTe substrate would be used with the appropriate layers of doped HgCdTe grown thereon. The photodetector would then be formed in part by removing a significant portion of the HgCdTe material via a masked etch process to leave only the elongate elements 102a,b, 103a,b and the collector element 104.

FIG. 2 shows placement of a second electrical contact layer 112 between the second elongate elements 103a,b and the collector element 104, and the reflector 110. The top of the first elongate elements 102a,b and second elongate elements 103a,b form a first common major surface 107. The bottom of the first elongate elements 102a,b and second elongate elements 103a,b form a second common major surface 109. The preferred thicknesses of the various elements for a VLWIR photodetector are 1.6 μm for the elongate elements 102a,b, 103a,b and the collector element 104, 0.8 μm for the carrier collector 106, 0.5 μm for both the first electrical contact 108 and the reflector 110, and 0.4 μm for the second electrical contact 112. Please note that while FIG. 2 shows a cross-section along second elongate elements 103a,b, a cross-section along first elongate elements 102a,b would be identical.

While the photodetector can be formed of a number of materials, its greatest potential is realized using the HgCdTe material system. Alternative semiconductor material systems include, but are not limited to, InSb and InGaAs. If the HgCdTe material system is used, the elongate elements 102a,b, 103a,b would preferably be formed of n-type HgCdTe material, the particular alloy of HgCdTe depending upon the desired absorption wavelength. The collector element 104 would likewise be formed of the same n-type HgCdTe material. The carrier collector 106 would be formed of p-type HgCdTe, thereby forming a p/n junction. This carrier collector 106 could be formed by implantation or diffusion. Diffusion is preferable by growing a sacrificial p-type layer, patterning and etching away a portion of this sacrificial layer, and then performing a thermal diffusion process. The remaining portion of the sacrificial layer would then be removed after diffusion was complete. This method of forming the p/n junction results in a self-passivated junction as the junction is formed completely within the collector element 104. The first electrical contact 108 and the reflector 110 are formed of metal, preferably Au or a Au alloy by an evaporation process. Alternatively, the reflector could be a Bragg reflector 110 and formed of suitable semiconductor or dielectric material layers. The second electrical contact 112 is a heavily doped wider bandgap n-type HgCdTe layer in this example.

Figure 3A:
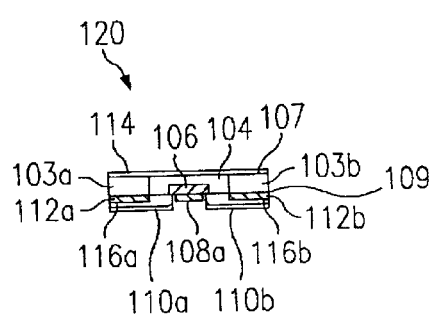
FIGS. 3a and 3b are cross-sectional views of a second and third embodiment of the present invention respectively.

FIG. 3a shows a cross-sectional view of a second embodiment of the present invention in which a first electrical contact 108a and the second electrical contact 112a,b are on the same side of the second elongate elements 103a,b of a photodetector 120. This is in contrast with the first embodiment unit cell 100 in which the first electrical contact 108 and the second electrical contact 112 were on opposing sides of the second elongate elements 103a,b. FIG. 3a includes a first passivation layer 114 on the surface of the second elongate elements 103a,b. This first passivation layer 114 is on the surface and the sides of the elongate elements 102a,b, 103a,b. A second passivation layer 116a,b is disposed between the second electrical contact 112a,b and the reflector 10a,b. The thickness of both the first 114 and the second 116a,b passivation layers is preferably 0.2 μm. If the photodetector is formed using the HgCdTe material system, the first 114 and second 116a,b passivation layers are preferably formed of CdTe or CdZnTe lattice matched to the HgCdTe used in the elongate elements 102a,b, 103a,b. As with FIG. 2, FIGS. 3a and 3b show a cross-section along second elongate elements 103a,b, a cross-section along first elongate elements 102a,b would be identical.

Figure 3B:
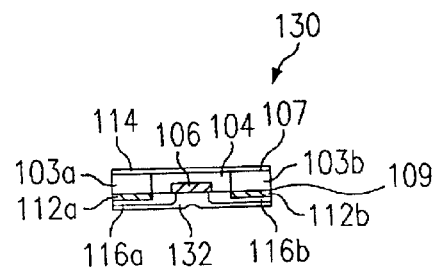

FIG. 3b shows a cross-sectional view of a third embodiment of the present invention utilizing an alternative fabrication method. The photodetector 130 includes a single metal layer 132 that is a combination of the first electrical contact 108a and the reflector 110a,b of the second embodiment.

A further alternative not illustrated, but similar to FIGS. 3a and 3b, would not require a separate second electrical contact 112. In this case, the elongate elements 102a,b, 103a,b would be sufficiently doped that their series resistance would be low. By having a low series resistance, the elongate elements 102a,b, 103a,b would not need a separate, low resistance second electrical contact 112, thereby simplifying material and fabrication requirements. This alternative could thus have a second contact formed of metal at the periphery of the photodetector or array of photodetectors.

Figure 4:
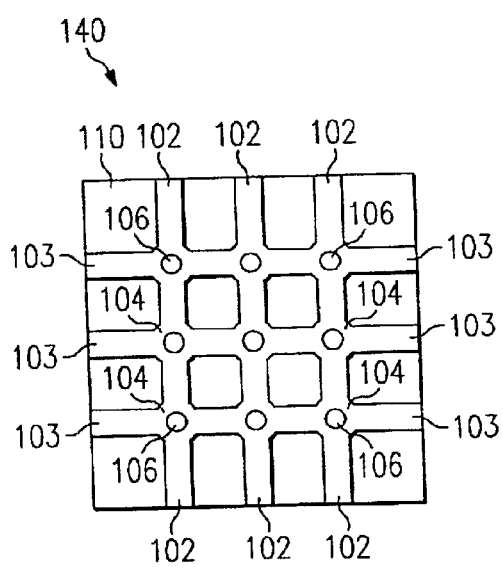
FIG. 4 is a top down view of a full photodetector of the second or third embodiment of the present invention.

FIG. 4 is a top down view of the second or third embodiment of the present invention and illustrates an entire photodetector 140. This is in contrast to FIG. 1 in which only the unit cell 100 is illustrated. FIG. 4 illustrates placement of a collector element 104 at each intersection of the first elongate elements 102 and the second elongate elements 103. The desirability of this configuration will be described below when photodetector operation is examined. Note that the first elongate elements 102 form a first one-dimensional diffraction grating and the second elongate elements 103 form a second one-dimensional diffraction grating. The combination of the first and second diffraction gratings thus forms a two-dimensional diffraction grating.

Figure 5:
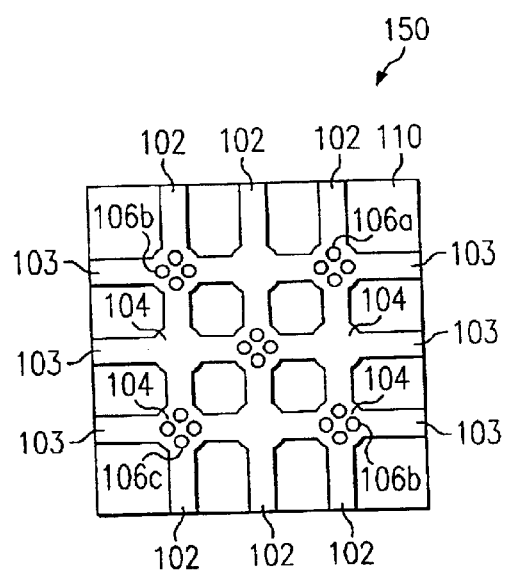
FIG. 5 is a top down view of a full photodetector of a fourth embodiment of the present invention.

FIG. 5 is a top down view of a fourth embodiment of the present invention and like FIG. 4 illustrates an entire photodetector 150. The photodetector 150 includes five collector elements 104 that are formed at only a few of the intersections of the first elongate elements 102 and the second elongate elements 103. Furthermore, each of the collector elements 104 includes multiple carrier collectors 106a–d. While four carrier collectors 106a–d are shown (which would preferably have a diameter of 1 μm in the VLWIR photodetector example), the number of carrier collectors 106a–d could be more or less than four. The diameter of the carrier collectors 106a–d would need to be adjusted according to their number and the size of the collector element 104.

Figure 6:
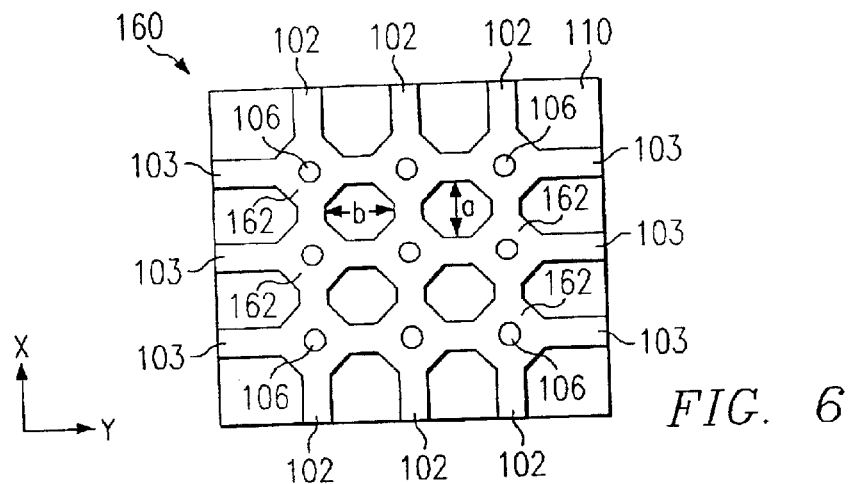
FIG. 6 is a top down view of a full photodetector of a fifth embodiment of the present invention.

FIG. 6 is a top down view of a fifth embodiment of a photodetector 160. The fifth embodiment includes two differences in comparison with the previous embodiments. The charge collector element 162 is not circular but of a diamond shape. Other shapes for the collector element are possible, including an oval. The second difference is the period between the first elongate elements 102. The first elongate elements 102 in the X direction form the first one-dimensional diffraction grating having a period of "a" while the second elongate elements 103 in the Y direction form the second diffraction grating having a period "b" that is greater than "a". The advantages of this biperiodic two-dimensional diffraction grating will be further explored below.

Figure 7:
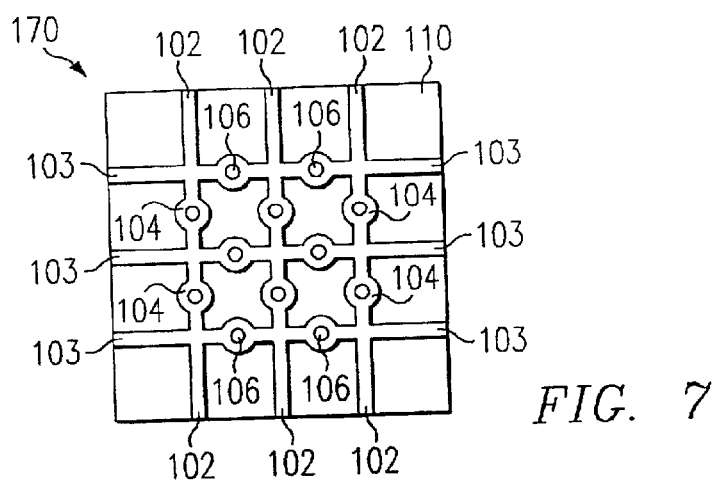
FIG. 7 is a top down view of a full photodetector of a sixth embodiment of the present invention.

FIG. 7 is a top down view of a sixth embodiment of a photodetector 170. The primary difference of this embodiment is placement of the collector elements 106 not at the intersection of the first elongate elements 102 and the second elongate elements 103, but midway between the intersections on elongate elements 102, 103.

Figure 8:
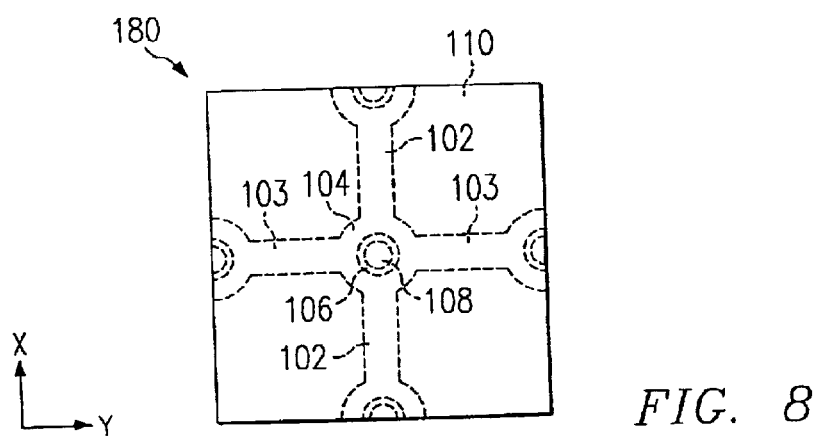
FIG. 8 is a top down view of a unit cell of a seventh embodiment of the present invention.

FIG. 8 is a top down view of a unit cell 180 of a seventh embodiment of a photodetector. The seventh embodiment is a combination of the first and sixth embodiments in that it includes collector elements 106 at both the intersections of the first elongate elements 102 and the second elongate elements 103, and midway between the intersections on first elongate elements 102 and second elongate elements 103. The advantages of this embodiment will be further explored below.

The operation of the various embodiments of the present invention will now be examined in detail. In each of the embodiments, incident IR radiation is absorbed in the elongate elements 102, 103. While the first elongate elements 102 and the second elongate elements 103 form the two-dimensional diffraction grating, due to the thickness of the elongate elements 102, 103, a three-dimensional diffractive resonant optical cavity (3D-DROC) is formed. By appropriately designing the 3D-DROC, a limited range of IR radiation wavelengths will resonate and be absorbed by the elongate elements 102, 103. It should be noted that this resonating IR radiation generates the highest electric field regions, and thus absorption, within the portion of the elongate elements 102, 103 nearest the collector elements 104, and in the collector elements 104 themselves. Due to the 3D-DROC, the quantum efficiency in this range of IR wavelengths remains high even though significant IR absorbing material has been removed. In the preferred embodiment, the elongate elements 102, 103 are n-type HgCdTe and the absorbed IR radiation creates electron-hole pairs. The minority carrier holes then drift toward the carrier collector 106. The carriers drift due to the electric field created between the n-type elongate elements 102, 103 and the p-type carrier collector 106, which form a p/n junction. This resultant current flow can be sensed as a voltage or a current in an external circuit via the first electrical contact 108 and the second electrical contact 112.

As maximum sensitivity requires collecting as many of the photogenerated minority carriers as possible, holes in the present example, the carriers must be collected before they recombine. For this reason a carrier collector 106 is preferably located within a diffusion length of the absorption location. As the diffusion length for holes in VLWIR HgCdTe is approximately 10 μm, a carrier collector 106 should be located at every intersection between the first elongate elements 102 and the second elongate elements 103 for a VLWIR photodetector. Thus, the embodiments shown in FIGS. 4, 6, and 7 would be preferred over the embodiment shown in FIG. 5. While the desirable multiple carrier collector 106 per collector element 104 configuration is shown only in FIG. 5, this configuration is compatible with the collector elements 104 illustrated in FIGS. 4 and 6–8. While the hole diffusion length is relatively short, as noted above the greatest absorption is near the collector elements 104 and carrier collectors 106. Thus, the holes have only a relatively short distance to drift before being collected.

To retain maximum sensitivity, it is desirable to minimize photogenerated carrier recombination at the surface of the elongate elements 102, 103. Including a first passivation layer 114 over the elongate elements 102, 103 does this. A second passivation layer 116a,b is desirable to insulate the carrier collector 106 from the reflector 110 so as not to short the carrier collector 106.

As the sensitivity is further determined by the thermally generated leakage current of the photodetector, it is desirable to minimize this source of noise. One way to minimize the thermal leakage current is by reducing the area of the carrier collector 106 p/n junction. By using four smaller carrier collectors 106a–d as shown in FIG. 4 as opposed to a single larger carrier collector 106 as shown in FIG. 1, this carrier collector area, and thus thermal leakage current and noise, can be reduced. Theoretical modeling indicates the sensitivity of these reduced thermal leakage current photodetector designs can lead to a factor of ten improvement in the sensitivity.

Traditionally, the exposed high field regions near the corners or surface of a p/n junction generate additional excess leakage current requiring careful passivation of the junction. By forming the carrier collector 106 p/n junctions within the collector elements 104, the resulting device has no exposed junction, i.e., the junction is self-passivated. Furthermore, the self-passivated junction is passivated by the collector element 104 that is of the same semiconductor material, such as HgCdTe, as the junction itself This results in a perfect lattice match for the entire photodetector and does not require any additional processing related to the junction.

An added benefit of the smaller carrier collector 106 p/n junction is that the operating temperature can be increased. In particular, the reduced noise allows an increase in the operating temperature before a given noise level threshold is met when compared with ordinary IR photodetectors. Alternatively, for a given operating temperature, a diffraction grating coupled IR photodetector will have reduced noise, and thus increased sensitivity, when compared to ordinary IR photodetectors.

Due to the relatively narrow spectral resonance of the 3D-DROC formed by the elongate elements 102, 103, some IR radiation is not detected. As this undetected radiation decreases the possible signal magnitude, it is desirable to broaden the spectral resonance of the photodetector. This can be done by at least two methods that will be described next.

The first spectral broadening method is to use a biperiodic diffraction grating as shown in FIG. 6. By having different periods in the X and Y directions, the first one-dimensional diffraction grating resonates at a different wavelength than the second one-dimensional diffraction grating within the 3D-DROC. A difference in resonant wavelengths of approximately ten percent will broaden the spectral response of the photodetector. However, this method is polarization dependent in the X and Y directions, which may be undesirable.

An alternative method of broadening the spectral response that is not polarization dependent is shown in FIG. 8. A photodetector having the unit cell 180 configuration shown in FIG. 8 will benefit from shorter diffusion lengths for the minority carriers. As the diffusion length decreases for longer wavelength photogenerated minority carriers, it is critical to capture these carriers before they recombine. By including additional carrier collectors 106 within the unit cell 180, these minority carriers are not lost. For this reason, the spectral response for a photodetector having the unit cell 180 configuration is broader on the long wavelength side than that achieved for a photodetector having the unit cell 100 configuration shown in FIG. 1.

The resonant wavelength of the 3D-DROC within the photodetector is primarily a function of the material geometry. The simplest variable is the period or unit cell size. In the VLWIR example, the period or unit cell size is 12 μm. By decreasing the unit cell size, the resonant wavelength can be decreased for operation in the long wavelength IR (LWIR) or middle wavelength IR (MWIR). Decreases in either the width or thickness of the elongate elements 102, 103 will also decrease the resonant wavelength. It must be noted that the absorption IR wavelength band of the elongate elements 102, 103 must match the resonant wavelength of the photodetector. As an example, if the elongate elements 102, 103 were formed of $Hg_{0.8}Cd_{0.2}Te$ that strongly absorbs at 10 μm, the 3D-DROC should be designed to resonate at 10 μm for optimal performance.

The preferred configuration of the photodetector is a function of the external sensing circuit. The configurations shown in FIGS. 1 and 2 are for a vertical current flow in which the first electrical contact 108 and the second electrical contact 112 are on opposite sides of the photodetector. For applications that require all connections to be on the same side, a usual requirement for IR focal plane arrays, the first electrical contact 108 and the second electrical contact 112 must be on the same side. This results in the lateral current flow configuration as shown in FIGS. 3a and 3b. An alternative vertical current flow configuration that is not illustrated would incorporate a layout similar to that of FIGS. 3a and 3b with a change in the second electrical contact layer 112 location. This un-illustrated configuration would place the second electrical contact layer 112 between the first passivation layer 114 and the elongate elements 102a,b, 103a,b. In this configuration, the second electrical contact layer 112 would be common to all photodetectors if an IR focal plane array were to be fabricated.

While each of the embodiments has been described and illustrated as a unit cell or single photodetector, arrays of photodetectors are envisioned. The arrays of photodetectors can be a one-dimensional line array, or a two-dimensional area array of photodetectors. In an application requiring a one-dimensional or two-dimensional array of photodetectors, the array of photodetectors can be mated to a silicon-based readout integrated circuit for multiplexing the resulting signals. The mating of the array of photodetectors and the readout circuit can include the use of indium bumps to provide electrical, mechanical, and thermal contact between the photodetectors and the readout circuit.

Although the present invention has been fully described by way of examples with reference to the accompanying drawings, it is to be noted that various changes and modifications will be apparent to those skilled in the art. Therefore, such changes and modifications should be construed as being within the scope of the invention.

What is claimed is:

1. An infrared radiation photodetector comprising:
    a plurality of first elongate semiconductor elements for absorbing infrared radiation thereby creating electrical carriers, the plurality of first elongate elements being arranged to form a first one-dimensional diffraction grating for infrared radiation;
    a plurality of second elongate semiconductor elements for absorbing infrared radiation thereby creating electrical carriers, the plurality of second elongate elements being arranged to form a second one-dimensional diffraction grating for infrared radiation, the plurality of second elongate elements being substantially perpendicular to and intersecting the plurality of first elongate elements so as to form a two-dimensional diffraction grating having a first common major surface and a second common major surface, the second common major surface being opposite the first common major surface;
    at least a portion of at least one of the first and second elongate elements being enlarged so as to form a collector element, each collector element forming a portion of the first common major surface and a portion of the second common major surface;
    at least one semiconductor carrier collector for collecting electrical carriers thus created by the first and second elongate elements, each respective carrier collector being formed in a portion of a respective collector element so as to form a portion of one of the first common major surface and the second common major surface;
    a first electrical contact which is electrically connected to the at least one carrier collector;
    a second electrical contact which is electrically connected to at least one of the plurality of first elongate elements and the plurality of second elongate elements, the first contact and the second contact being disposed so as to provide for electrical carrier flow through the first and second elongate elements; and
    a reflector for infrared radiation, the reflector being closer to the second common major surface of the two-dimensional diffraction grating than to the first common major surface of the two-dimensional diffraction grating.

2. An infrared radiation photodetector in accordance with claim 1, wherein each respective one of the at least one collector element is formed at a respective intersection of a first elongate element and a second elongate element.

3. An infrared radiation photodetector in accordance with claim 1, wherein each intersection of a first elongate element and a second elongate element includes a respective collector element.

4. An infrared radiation photodetector in accordance with claim 1, wherein each respective one of the at least one collector element is formed in a first elongate element substantially midway between a first intersection of that first elongate element and one second elongate element and a second intersection of that first elongate element and a different second elongate element, the one second elongate element being adjacent to the different second elongate element.

5. An infrared radiation photodetector in accordance with claim 1, wherein a respective one of the at least one collector element is formed in each respective first elongate element substantially midway between a respective first intersection of that respective first elongate element and a respective one second elongate element and a respective second intersection of that respective first elongate element and a respective different second elongate element, the respective one second elongate element being adjacent to the respective different second elongate element.

6. An infrared radiation photodetector in accordance with claim 1, wherein a first one of the at least one collector element is formed at a respective intersection of a first elongate element and a second elongate element, and wherein at least a second one of the at least one collector element is formed in a second first elongate element substantially midway between a first intersection of that second first elongate element and one second elongate element and a second intersection of that second first elongate element and a different second elongate element, the one second elongate element being adjacent to the different second elongate element.

7. An infrared radiation photodetector in accordance with claim 1, wherein the plurality of first elongate elements, the plurality of second elongate elements, and the at least one collector element comprise n-type semiconductor material and the at least one carrier collector comprises p-type semiconductor material.

8. An infrared radiation photodetector in accordance with claim 1, wherein the plurality of first elongate elements, the plurality of second elongate elements, the at least one collector element, and the at least one carrier collector comprise II–VI semiconductor material.

9. An infrared radiation photodetector in accordance with claim 8, wherein the semiconductor material comprises HgCdTe semiconductor material.

10. An infrared radiation photodetector in accordance with claim 1, wherein the plurality of first elongate elements, the plurality of second elongate elements, the at least one collector element, and the at least one carrier collector comprise III–V semiconductor material.

11. An infrared radiation photodetector in accordance with claim 10, wherein the semiconductor material comprises InSb semiconductor material.

12. An infrared radiation photodetector in accordance with claim 10, wherein the semiconductor material comprises InGaAs semiconductor material.

13. An infrared radiation photodetector in accordance with claim 1, wherein the first contact and the at least one carrier collector are adjacent to the first common major surface of the two-dimensional diffraction grating and the second contact is adjacent to the second common major surface of the two-dimensional diffraction grating.

14. An infrared radiation photodetector in accordance with claim 1, wherein the first contact, the at least one carrier collector, and the second contact are adjacent the second common major surface of the two-dimensional diffraction grating.

15. An infrared radiation photodetector in accordance with claim 1, wherein each of the at least one collector element is a circular disk.

16. An infrared radiation photodetector in accordance with claim 1, wherein a period of the first one-dimensional diffraction grating and a period of the second one-dimensional diffraction grating are equal to each other.

17. An infrared radiation photodetector in accordance with claim 1,
wherein the first diffraction grating resonates at a first infrared radiation wavelength;
wherein the second diffraction grating resonates at a second infrared radiation wavelength; and
wherein the first infrared radiation wavelength is within ten percent of the second infrared radiation wavelength.

18. An infrared radiation photodetector in accordance with claim 1, wherein the reflector comprises a metal or a metal alloy.

19. An infrared radiation photodetector in accordance with claim 1, wherein the reflector comprises a Bragg reflector.

20. An infrared radiation photodetector in accordance with claim 1, further comprising a first passivation layer disposed on the two-dimensional diffraction grating.

21. An infrared radiation photodetector in accordance with claim 1, further comprising a second passivation layer disposed between the second common major surface of the two-dimensional diffraction grating and the reflector.

22. An infrared radiation photodetector in accordance with claim 1:
wherein the plurality of first elongate elements, the plurality of second elongate elements, and the at least one collector element comprise n-type semiconductor material and the at least one carrier collector comprises p-type semiconductor material, and
wherein the reflector comprises a metal or a metal alloy.

23. An infrared radiation photodetector in accordance with claim 22, wherein each intersection of a first elongate element and a second elongate element includes a respective collector element.

24. An infrared radiation photodetector in accordance with claim 22, wherein the plurality of first elongate elements, the plurality of second elongate elements, the at least one collector element, and the at least one carrier collector comprise II–VI semiconductor material.

25. An infrared radiation photodetector in accordance with claim 22, wherein the plurality of first elongate elements, the plurality of second elongate elements, the at least one collector element, and the at least one carrier collector comprise III–V semiconductor material.

26. An infrared radiation photodetector in accordance with claim 22, wherein the first contact, the at least one carrier collector, and the second contact are adjacent the second common major surface of the two-dimensional diffraction grating.

27. An infrared radiation photodetector in accordance with claim 22, further comprising a first passivation layer disposed on the two-dimensional diffraction grating.

28. An infrared radiation photodetector in accordance with claim 22, further comprising a second passivation layer disposed between the second common major surface of the two-dimensional diffraction grating and the metallic reflector.

29. An infrared radiation photodetector in accordance with claim 1:
wherein the plurality of first elongate elements, the plurality of second elongate elements, and the at least one collector element comprise n-type HgCdTe semiconductor material and the at least one carrier collector comprises p-type HgCdTe semiconductor material,
wherein a period of the first one-dimensional diffraction grating and a period of the second one-dimensional diffraction grating are equal to each other,
wherein each intersection of a first elongate element and a second elongate element includes a respective collector element,
wherein the first contact, the at least one carrier collector, and the second contact are adjacent the second common major surface of the two-dimensional diffraction grating, and
wherein the reflector comprises a metal or a metal alloy.

30. An infrared radiation photodetector focal plane array including a plurality of photodetector pixel structures, each of the pixel structures comprising:
a plurality of first elongate semiconductor elements for absorbing infrared radiation thereby creating electrical carriers, the plurality of first elongate elements being arranged to form a first one-dimensional diffraction grating for infrared radiation;

a plurality of second elongate semiconductor elements for absorbing infrared radiation thereby creating electrical carriers, the plurality of second elongate elements being arranged to form a second one-dimensional diffraction grating for infrared radiation, the plurality of second elongate elements being substantially perpendicular to and intersecting the plurality of first elongate elements so as to form a two-dimensional diffraction grating having a first common major surface and a second common major surface, the second common major surface being opposite the first common major surface;

at least a portion of at least one of the first and second elongate elements being enlarged so as to form a collector element, each collector element forming a portion of the first common major surface and a portion of the second common major surface;

at least one semiconductor carrier collector for collecting electrical carriers thus created by the first and second elongate elements, each respective carrier collector being formed in a portion of a respective collector element so as to form a portion of one of the first common major surface and the second common major surface;

a first electrical contact which is electrically connected to the at least one carrier collector;

a second electrical contact which is electrically connected to at least one of the plurality of first elongate elements and the plurality of second elongate elements, the first contact and the second contact being disposed so as to provide for electrical carrier flow through the first and second elongate elements; and a reflector for infrared radiation, the reflector being closer to the second common major surface of the two-dimensional diffraction grating than to the first common major surface of the two-dimensional diffraction grating.

31. An infrared radiation photodetector focal plane array in accordance with claim 30, wherein each respective one of the at least one collector element is formed at a respective intersection of a first elongate element and a second elongate element in each one of the pixel structures.

32. An infrared radiation photodetector focal plane array in accordance with claim 30, wherein each intersection of a first elongate element and a second elongate element in each one of the pixel structures includes a respective collector element.

33. An infrared radiation photodetector focal plane array in accordance with claim 30, wherein each respective one of the at least one collector element in each one of the pixel structures is formed in a first elongate element substantially midway between a first intersection of that first elongate element and one second elongate element and a second intersection of that first elongate element and a different second elongate element, the one second elongate element being adjacent to the different second elongate element.

34. An infrared radiation photodetector focal plane array in accordance with claim 30, wherein a respective one of the at least one collector element in each one of the pixel structures is formed in each respective first elongate element substantially midway between a respective first intersection of that respective first elongate element and a respective one second elongate element and a respective second intersection of that respective first elongate element and a respective different second elongate element, the respective one second elongate element being adjacent to the respective different second elongate element.

35. An infrared radiation photodetector focal plane array in accordance with claim 30,
wherein a first one of the at least one collector element in each one of the pixel structures is formed at a respective intersection of a first elongate element and a second elongate element, and
wherein at least a second one of the at least one collector element in each one of the pixel structures is formed in a second first elongate element substantially midway between a first intersection of that second first elongate element and one second elongate element and a second intersection of that second first elongate element and a different second elongate element, the one second elongate element being adjacent to the different second elongate element.

36. An infrared radiation photodetector focal plane array in accordance with claim 30, wherein the plurality of first elongate elements, the plurality of second elongate elements, and the at least one collector element comprise n-type semiconductor material and the at least one carrier collector comprises p-type semiconductor material in each one of the pixel structures.

37. An infrared radiation photodetector focal plane array in accordance with claim 30, wherein the plurality of first elongate elements, the plurality of second elongate elements, the at least one collector element, and the at least one carrier collector comprise IIVI semiconductor material in each one of the pixel structures.

38. An infrared radiation photodetector focal plane array in accordance with claim 37, wherein the semiconductor material comprises HgCdTe semiconductor material in each one of the pixel structures.

39. An infrared radiation photodetector focal plane array in accordance with claim 30, wherein the plurality of first elongate elements, the plurality of second elongate elements, the at least one collector element, and the at least one carrier collector comprise IIIV semiconductor material in each one of the pixel structures.

40. An infrared radiation photodetector focal plane array in accordance with claim 39, wherein the semiconductor material comprises InSb semiconductor material in each one of the pixel structures.

41. An infrared radiation photodetector focal plane array in accordance with claim 39, wherein the semiconductor material comprises InGaAs semiconductor material in each one of the pixel structures.

42. An infrared radiation photodetector focal plane array in accordance with claim 30, wherein the first contact and the at least one carrier collector are adjacent to the first common major surface of the two-dimensional diffraction grating and the second contact is adjacent to the second common major surface of the two-dimensional diffraction grating in each one of the pixel structures.

43. An infrared radiation photodetector focal plane array in accordance with claim 30, wherein the first contact, the at least one carrier collector, and the second contact are adjacent the second common major surface of the two-dimensional diffraction grating in each one of the pixel structures.

44. An infrared radiation photodetector focal plane array in accordance with claim 30, wherein each of the at least one collector element in each one of the pixel structures is a circular disk.

45. An infrared radiation photodetector focal plane array in accordance with claim 30, wherein a period of the first one-dimensional diffraction grating and a period of the second one-dimensional diffraction grating are equal to each other in each one of the pixel structures.

46. An infrared radiation photodetector focal plane array in accordance with claim 30,
wherein the first diffraction grating in each one of the pixel structures resonates at a first infrared radiation wavelength;
wherein the second diffraction grating in each one of the pixel structures resonates at a second infrared radiation wavelength; and
wherein the first infrared radiation wavelength is within ten percent of the second infrared radiation wavelength in each one of the pixel structures.

47. An infrared radiation photodetector focal plane array in accordance with claim 30, wherein the reflector in each one of the pixel structures comprises a metal or a metal alloy.

48. An infrared radiation photodetector focal plane array in accordance with claim 30, wherein the reflector in each one of the pixel structures comprises a Bragg reflector.

49. An infrared radiation photodetector focal plane array in accordance with claim 30, further comprising a first passivation layer disposed on the two-dimensional diffraction grating in each one of the pixel structures.

50. An infrared radiation photodetector focal plane array in accordance with claim 30, further comprising a second passivation layer disposed between the second common major surface of the two-dimensional diffraction grating and the reflector in each one of the pixel structures.

51. An infrared radiation photodetector focal plane array in accordance with claim 30:
wherein the plurality of first elongate elements, the plurality of second elongate elements, and the at least one collector element comprise n-type semiconductor material and the at least one carrier collector comprises p-type semiconductor material in each one of the pixel structures, and
wherein the reflector in each one of the pixel structures comprises a metal or a metal alloy.

52. An infrared radiation photodetector focal plane array in accordance with claim 51, wherein each intersection of a first elongate element and a second elongate element includes a respective collector element in each one of the pixel structures.

53. An infrared radiation photodetector focal plane array in accordance with claim 51, wherein the plurality of first elongate elements, the plurality of second elongate elements, the at least one collector element, and the at least one carrier collector comprise II–VI semiconductor material in each one of the pixel structures.

54. An infrared radiation photodetector focal plane array in accordance with claim 51, wherein the plurality of first elongate elements, the plurality of second elongate elements, the at least one collector element, and the at least one carrier collector comprise IIIV semiconductor material in each one of the pixel structures.

55. An infrared radiation photodetector focal plane array in accordance with claim 51, wherein the first contact, the at least one carrier collector, and the second contact are adjacent the second common major surface of the two-dimensional diffraction grating in each one of the pixel structures.

56. An infrared radiation photodetector focal plane array in accordance with claim 51, further comprising a first passivation layer disposed on the two-dimensional diffraction grating in each one of the pixel structures.

57. An infrared radiation photodetector focal plane array in accordance with claim 51, further comprising a second passivation layer disposed between the second common major surface of the two-dimensional diffraction grating and the metallic reflector in each one of the pixel structures.

58. An infrared radiation photodetector focal plane array in accordance with claim 30:
wherein the plurality of first elongate elements, the plurality of second elongate elements, and the at least one collector element comprise n-type HgCdTe semiconductor material and the at least one carrier collector comprises p-type HgCdTe semiconductor material in each one of the pixel structures,
wherein a period of the first one-dimensional diffraction grating and a period of the second one-dimensional diffraction grating are equal to each other in each one of the pixel structures,
wherein each intersection of a first elongate element and a second elongate element includes a respective collector element in each one of the pixel structures,
wherein the first contact, the at least one carrier collector, and the second contact are adjacent the second common major surface of the two-dimensional diffraction grating in each one of the pixel structures, and
wherein the reflector in each one of the pixel structures comprises a metal or a metal alloy.

59. An infrared radiation photodetector focal plane array in accordance with claim 30, wherein the focal plane array is a one-dimensional focal plane array.

60. An infrared radiation photodetector focal plane array in accordance with claim 30, wherein the focal plane array is a two-dimensional focal plane array.

* * * * *

UNITED STATES PATENT AND TRADEMARK OFFICE
CERTIFICATE OF CORRECTION

PATENT NO. : 6,828,642 B2
DATED : December 7, 2004
INVENTOR(S) : Lewis T. Claiborne et al.

It is certified that error appears in the above-identified patent and that said Letters Patent is hereby corrected as shown below:

Title page,
Item [73], Assignee, delete "Lockhead" and insert -- Lockheed --.

Column 12,
Line 29, delete "IIVI" and insert -- II-VI --.
Line 39, delete "IIIV" and insert -- III-V --.

Column 14,
Line 5, delete "IIIV" and insert -- III-V --.

Signed and Sealed this

Twelfth Day of April, 2005

JON W. DUDAS
*Director of the United States Patent and Trademark Office*